United States Patent [19]

Alemanni

[11] Patent Number: 4,591,053
[45] Date of Patent: May 27, 1986

[54] INTEGRATED CIRCUIT CARRIER

[75] Inventor: James C. Alemanni, Oceanside, Calif.

[73] Assignee: Gibson-Egan Company, Duarte, Calif.

[21] Appl. No.: 628,232

[22] Filed: Jul. 6, 1984

[51] Int. Cl.[4] .............................................. B65D 73/02
[52] U.S. Cl. .................................... 206/331; 206/352; 206/334
[58] Field of Search ............... 206/328, 331, 332, 334; 339/17 CF, 76, 79; 174/138 G, 117 F

[56] References Cited

U.S. PATENT DOCUMENTS

| | | | |
|---|---|---|---|
| 3,409,861 | 11/1968 | Barnes et al. | 206/334 |
| 3,454,921 | 7/1969 | Coleman et al. | 206/331 |
| 3,469,684 | 9/1969 | Keady et al. | 206/331 |
| 3,652,974 | 3/1972 | Tems | 206/331 |
| 3,746,157 | 7/1973 | I'Anson | 206/331 |
| 3,858,721 | 1/1975 | Boyer et al. | 206/331 |
| 4,026,412 | 5/1977 | Henson | 206/334 |
| 4,379,505 | 4/1983 | Alemanni | 206/329 |
| 4,483,441 | 11/1984 | Akizawa et al. | 206/334 |

Primary Examiner—Joseph Man-Fu Moy
Attorney, Agent, or Firm—Christie, Parker & Hale

[57] ABSTRACT

A one-piece integrated circuit carrier includes a base having a central opening bounded at opposite ends by walls having a plurality of narrow, parallel elongated grooves for receiving the leads of an integrated circuit flat pack inserted in the opening of the carrier. A pair of elongated resilient retaining fingers extend along opposite edges of the opening for connecting to the four outermost leads of the flat pack to hold the integrated circuit in the carrier. A pair of retaining fingers on each side of the carrier are supported from a narrow central support web, and the fingers extend in opposite directions from the support web generally parallel to the leads of the flat pack. The fingers terminate in free ends near the corners of the central opening in the carrier. Flanged tips at the free ends of the retaining fingers fit over the outermost leads of the flat pack to retain it. The flat pack is inserted into the carrier by pushing generally horizontally outwardly on the tips of the retaining fingers to spread them apart sufficiently to allow the body of the flat pack to be inserted in the opening of the carrier. The outermost leads of the flat pack bypass the spaced apart fingers so the leads can be inserted into the grooves at opposite ends of the opening. Upon release of the applied horizontal force the fingers return to normal positions in which the flanged tips of the fingers extend over and frictionally contact the tops of the outermost leads to retain the flat pack in the carrier. Advantages are that the flat pack is retained in the carrier by connection to leads instead of the flat pack body and the retaining fingers have improved resiliency and memory with reduced stress when connecting them to the leads, making continued reuse of the integrated circuit carrier possible.

14 Claims, 6 Drawing Figures

U.S. Patent    May 27, 1986    4,591,053
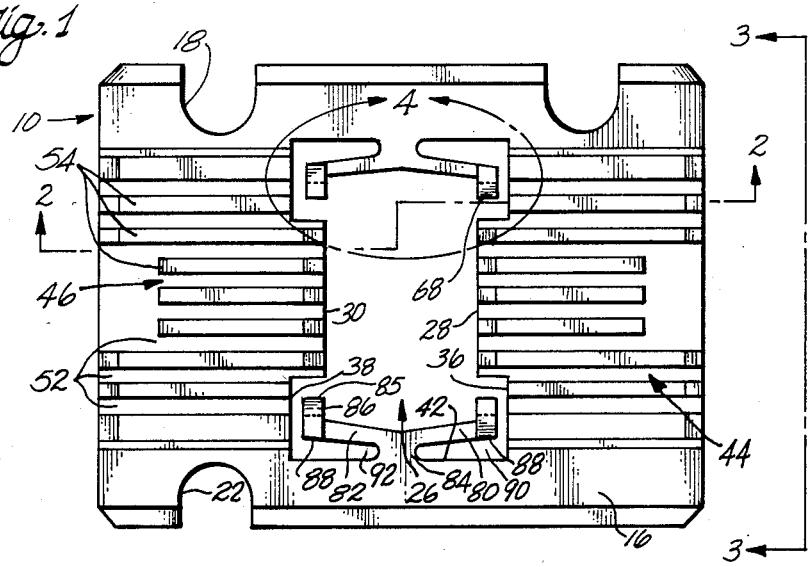

INTEGRATED CIRCUIT CARRIER

FIELD OF THE INVENTION

This invention relates to a carrier for a flat pack type integrated circuit having a body with a number of parallel leads projecting from opposite ends of the flat pack body. More particularly, the invention relates to a carrier that connects to the leads rather than the body of the flat pack.

BACKGROUND OF THE INVENTION

Integrated circuit flat packs are exceedingly small. They are manufactured in the millions and are commonly placed in individual carriers that protect them during subsequent handling steps. While in the carriers, the integrated circuit flat packs can be marked and tested, for example.

Presently known integrated circuit carriers can require rather complex mechanisms for inserting the integrated circuit flat packs into the carriers. Carriers that connect to the body of the integrated circuit can interfere with subsequent marking of the flat pack body. Carriers that connect to the body of the integrated circuit also can experience difficulty in properly connecting to the body of the integrated circuit, or they can inadvertently rupture the seal of a flat pack body which tends to be brittle.

It is common practice to remove integrated circuit flat packs from their carriers to mechanically bend the leads into desired configurations for subsequent connection to printed circuit boards. The integrated circuits, after the leads are bent, are commonly placed in trays, rather then being reinserted into their individual carriers. Many presently known carriers prevent integrated circuits, which have had their leads bent, from being reinserted into the carriers. Thus, carriers are not available to protect the integrated circuits once they are removed and the leads modified.

Presently known integrated circuit carriers are disclosed in U.S. Pat. No. 3,409,861 to Barnes et al., U.S. Pat. No. 3,529,277 to Barnes, and U.S. Pat. No. 3,652,974 to Tems. These patents relate to integrated circuit carriers that connect to the body of the flat pack. My U.S. Pat. No. 4,379,505 represents an improvement over these integrated circuit carriers.

The integrated circuit carrier disclosed in my U.S. Pat. No. 4,379,505 is used with a simplified mechanism for inserting the integrated circuit flat pack into the carrier. The carrier connects to the leads of the integrated circuit rather than the integrated circuit body; and as a result the integrated circuit body is completely exposed at the top of the carrier for subsequent marking or other handling steps. The carrier also facilitates removal of the flat pack from the carrier, bending of the leads into desired configurations, and reuse of the flat pack carrier by reinserting the flat pack into the carrier. Even though the leads have been bent or have otherwise had their configuration modified, the flat pack still can be reinserted into the carrier.

The integrated circuit carrier disclosed in my U.S. Pat. No. 4,379,505 patent has elongated fingers extending diagonally inwardly from the four corners of a rectangular opening in the carrier. The flat pack is quickly and easily inserted into the carrier by automated equipment using vertical pins to push the fingers apart sufficiently to allow the flat pack body to be inserted in the opening in the carrier, after which the vertical pins are retracted to allow the fingers to bend back to their original positions for connecting to the outermost leads of the integrated circuit. However, bending the fingers of the integrated circuit carrier can adversely affect the ability to reuse the carrier. That is, as long as the carrier (especially the fingers of the carrier) are made from a reasonably highly resilient material, the fingers will have sufficient "memory" to return to their original positions after the bending force is removed. If they do not return to precisely their original positions then they may not properly connect to the leads of a subsequent integrated circuit when the carrier is later reused. The carrier disclosed in my U.S. Pat. No. 4,379,505 patent required a high memory resilient material, but such a material also is a disadvantage. It is important to provide an anti-static carrier and it is common to load the plastic carrier material with carbon or other fillers to increase electrical conductivity so the carrier material will quickly discharge static electricity. However, addition of such fillers decreases the ductility of the carrier, and decreased ductility results in a similar decrease in the flexibility of the retaining fingers that connect to the leads. If the integrated circuit carrier disclosed in my patent is made from such an anti-static material, the retaining fingers are not sufficiently resilient to have the memory required to allow the carrier to be reused more than about once or twice.

The present invention provides an improved integrated circuit carrier having retaining fingers that connect to the leads of the integrated circuit flat pack. The retaining fingers are configured and arranged such that they maintain a high resiliency with good memory, even though the carrier is made from low ductility anti-static materials. The improved flexibility and memory of the retaining fingers makes it possible to re-use the integrated circuit carrier a large number of times, many more than the carrier disclosed in my U.S. Pat. No. 4,379,505 patent. Other advantages also are provided and are described in detail below.

SUMMARY OF THE INVENTION

Briefly, this invention provides a carrier for an integrated circuit flat pack having a body with a plurality of leads projecting from opposite ends of the body. The carrier includes a base having an opening for receiving the body of the flat pack. End walls at opposite ends of the opening have a plurality of grooves for receiving the leads of the flat pack. Resilient elongated retaining fingers are on opposite sides of the opening between the opposite grooved end portions of the base. A pair of retaining fingers on each side of the opening extend are supported approximately centrally along the side of the opening and extend in opposite directions generally parallel to the length of the leads of the flat pack alongside the body of the flat pack. The resilient retaining fingers on each side of the opening extend to free ends located near the corners of the opening. The length of each retaining finger is spaced inwardly from the side edge of the opening to which it is supported. The retaining fingers have flanged tips that project transversely to the length of the leads on the flat pack. The retaining fingers are bendable outwardly toward the edge of the opening on which they are supported under application of a generally horizontal bending force, for allowing the leads of the flat pack to bypass the bent retaining fingers and fit into the grooves at opposite ends of the opening. The retaining fingers return to a normal locking position when the bending force is released for fitting the flanged tips over the adjacent leads of the flat pack for retaining the flat pack in the opening of the carrier.

In one embodiment, the retaining fingers are arranged on the base of the carrier so that the fingers extend alongside the flat pack body and over only the outermost leads of the flat pack. The fingers contact the leads close to the flat pack body where the leads have the greatest stiffness. The remainder of the opening in the carrier can be entirely open, unobscured by any means for connecting to the flat pack or for supporting the flat pack body. Thus, the entire top and bottom of the flat pack body can be exposed for marking.

The arrangement for supporting the retaining fingers on the integrated circuit body ensures a sufficient length of the fingers to enhance their flexibility. This arrangement also makes it possible to limit the stress exerted on the fingers when applying bending forces for connecting the fingers to the leads of the flat pack. This combination makes it possible to use low ductility anti-static materials and still have sufficient resiliency and reduced overstressing during use that makes the integrated circuit carrier capable of extended reuse.

These and other aspects of the invention will be more fully understood by referring to the following detailed description and the accompanying drawings.

DRAWINGS

FIG. 1 is a top plan view showing an integrated circuit carrier according to principles of this invention.

FIG. 2 is a cross-sectional view taken on line 2—2 of FIG. 1.

FIG. 3 is an end elevation view taken on line 3—3 of FIG. 1.

FIG. 4 is an enlarged fragmentary top plan view taken within the circle 4 of FIG. 1.

FIG. 5 is an enlarged cross-sectional view broken away to show a side elevation of a retaining finger of the integrated circuit carrier.

FIG. 6 is a perspective view illustrating an integrated circuit flat pack to be inserted in the carrier of this invention.

DETAILED DESCRIPTION

An integrated circuit carrier 10 comprises a generally rectangular one-piece structure preferably made of hard plastic. The carrier generally includes a base 12 having first and second flanges 14 and 16 extending along opposite sides of the base. A pair of spaced apart and generally U-shaped slots 18 and 20 are formed in the edge of the first flange, and a single U-shaped slot 22 is formed in the edge of the second flange. An elongated groove 24 (see FIG. 3) extends along the underside of the first flange. The number, size and positions of the slots and grooves in the bottom of the flanges can vary and are merely shown as examples of means that cooperate with various types of mechanized equipment (not shown) for handling the carrier in a well-known manner.

The base has a general rectangular central opening 26 having a narrow central region extending between a pair of spaced apart and parallel right and left edges 28 and 30 (as viewed in FIG. 1) on opposite sides of about the middle half of the central opening. The four corners of the generally rectangular opening are enlarged relative to the narrower central region of the opening. On the first side of the base the enlargement of the opening is formed by right and left recessed regions 32 and 34, respectively, extending outwardly at right angles from the right and left edges of the narrow central region of the opening. Similarly, on the second side of the base, the enlargement of the opening is formed by right and left recessed regions 36 and 38, respectively, also extending out at right angles from the right and left edges of the narrow central region of the opening. The recessed regions 32, 34 of the opening on the first side of the base extend for about one-fourth the length of the opening through the base. Similarly, the recessed regions 36, 38 of the opening on the second side of the base also extend for about one-fourth the length of the opening. The depth of the recessed regions is about one-fourth the width of the narrower central region of the opening, and all four recessed regions are uniform in size.

The opening 26 also has first and second end walls 40 and 42 extending between the right and left sides of the enlarged recessed regions of the first and second sides of the opening.

The base has right and left end walls 44 and 46 extending outwardly from the right and left sides, respectively, of the central opening 26. When the carrier is normally placed in its horizontal position, the right and left end walls 44, 46 extend horizontally away from the opposite sides of the central opening 26.

A plurality of parallel, narrow, upwardly opening elongated grooves 48 are formed between upstanding, elongated ribs 50 on the right end wall 44; and an identical number of parallel, narrow, upwardly opening elongated grooves 52 are formed between upstanding elongated ribs 54 on the upper surface of the left end wall 46. The end walls 44 and 46 provide lead-supporting walls for the carrier at opposite ends of the opening. That is each groove is shaped to receive one of the leads on an integrated circuit flat pack inserted into the carrier. The illustrated embodiment shows an integrated circuit carrier for a 16-lead integrated circuit flat pack, and therefore there are eight grooves on each end wall of the carrier. The grooves are equidistantly spaced apart, and the spacing between the end walls 28 and 30 is slightly greater than the width of the flat pack body. The width of each individual groove is only slightly greater than the width of the leads on the integrated circuit. The carrier provides a means for retaining an integrated circuit flat pack generally of the type illustrated in FIG. 6, which includes an integrated circuit body 56 having a number of long filament-like electrical leads 58 extending parallel to one another from a right end of the body and an identical number of parallel electrical leads 60 extending outwardly from the left end of the body. In the illustrated embodiment there are eight leads extending from each end of the integrated circuit body.

The integrated circuit body is placed in the carrier by placing the body 56 of the flat pack in the opening 26 with the electrical leads 58 and 60 extending into the grooves 48 and 52 on the right and left end walls of the base. The integrated circuit body is held in the opening of the carrier by four separate narrow elongated, resilient retaining fingers 62, 64, 80 and 82 which connect to the four outermost leads of the flat pack. As shown in FIG. 6, the fingers connect to points a, b, c and d on the leads of the flat pack. The techniques for placing the integrated circuit in the carrier and for connecting the fingers to the leads are described in more detail below.

The four narrow elongated resilient retaining fingers project into the four enlarged recessed regions 32, 34, 36 and 38 at the four corners of the central opening 26. A first pair of right and left retaining fingers 62 and 64, respectively, are both supported from a narrow first support web 66 at the center of the first end wall 40 of the opening. The first pair of retaining fingers 62 and 64 extend away from right and left sides of the support web toward the right and left recessed regions 32 and 34 on the first side of the base. The first retaining fingers extend generally parallel to the long axes of the parallel grooves 48 and 52 in the base. These retaining fingers are formed integrally with the central support web 66, and the support web is an integral part of the base. The thickness of the first pair of retaining fingers is the same as that of their support web 66; and as shown best in FIG. 2, the thickness is the same as the thickness of the grooved portions 48 and 52 of the base end walls 44 and 46. The free ends of the first right and left retaining fingers terminate in the right and left recessed regions 32 and 34 on the first side of the base. The free end of each first retaining finger has lead-connecting means in the form of a flanged tip that includes a projecting flange 68 extending generally at a right angle away from the long axis of the finger toward the central opening of the base. As shown best in FIG. 5, the flanged tip of each finger has an upright front face 70, a shoulder 72 on the underside of the flanged tip extending diagonally downwardly away from the front face 70, and an upright rear face 74 spaced inwardly from the first end wall 40 of the opening. Since the first retaining fingers 62 and 64 extend generally along a shallow angle rather than truly parallel to the end wall 40, long, narrow tapered right and left open spaces 76 and 78 are formed between the outer edges of the first right and left retaining fingers 62 and 64 and the first end wall 40 of the opening.

A second pair of right and left retaining fingers 80 and 82, respectively, are identical in construction and arrangement of the first pair of retaining fingers 62 and 64. As shown best in FIG. 1, the second pair of right and left retaining fingers 80 and 82 are both supported by a narrow second support web 84 at the center of the second end wall 42 of the central opening 26. The second pair of retaining fingers extend away from right and left sides of their support web toward the right and left recessed regions 36 and 38 on the second side of the base. The second right and left retaining fingers extend generally parallel to the long axes of the parallel grooves in the base. The second retaining fingers are formed integrally with the second central support web 84, and the support web is an integral part of the base. The thickness of the second pair of retaining fingers is the same as that of their supporting web 84 and also is the same as the thickness of the grooved portions 48 and 52 of the base end walls 44 and 46.

The free ends of the second pair of retaining fingers terminate in the right and left recessed regions 36 and 38 at the second side of the base, and the free end of each second retaining finger has a flanged lead-connecting tip 86 identical to the flanged tips 68 of the first retaining fingers. Thus, the flanged tips 86 of the second retaining fingers extend generally at a right angle away from the long axes of the fingers toward the center opening of the base. The flanged tips of the second retaining fingers each have an upright front face 85, a shoulder 87 on the underside of the flanged tip extending diagonally downwardly away from the front face, and an upright rear face 88 spaced from the second end wall 42 of the central opening 26. Since the second pair of retaining fingers extend generally on a shallow angle rather than truly parallel to the end wall 42, long, narrow tapered right and left open spaces 90 and 92, respectively, are formed between the outer edges 88 of the second pair or retaining fingers and the second end wall 42 of the opening.

Thus, the tips of the fingers extend perpendicularly to the length of the grooves at opposite ends of the carrier; and during use they extend perpendicularly to the length of the leads 58 and 60 of the flat pack when the flat pack is placed in the carrier. As shown best in FIG. 4, when the flat pack body is in the opening of the carrier and the leads on the flat pack are in the grooves of the carrier, the flanged tip of each finger fits over the top of the closest outermost lead, and the diagonal shoulders 72 and 87 on the underside of the flanged tips contact the tops of the leads. The flanged tips of the retaining fingers are all at the same elevation and the fingers are all identical in structure. The flanged tips of the first pair of retaining fingers 62 and 64 also are aligned longitudinally as are the flanged tips of the second pair of retaining fingers.

The integrated circuit body can rest in the central opening while the flat pack is held in place only by its connection to the flanged tips of the retaining fingers. This exposes both the top and bottom of the flat pack entirely within the central opening of the carrier. Alternatively, ridges such as a ridge 94 shown in FIG. 5 can project from the bottom central portions of the retaining fingers into the first and second sides of the opening to provide opposite support surfaces on which the opposite ends of the flat pack body can rest while the leads of the integrated circuit body are simultaneously connected to and retained by the flanged tips of the fingers.

As shown best in FIG. 4, the flanged tips of the fingers on each side of the carrier are spaced apart by a distance just slightly greater than the width of the flat pack body. This allows the fingers to engage the outermost leads adjacent the flat pack body where the leads have the greatest stiffness. This enhances the ability to retain the flat pack in the carrier opening by contact only with the outermost leads. Preferably, the tips of the retaining fingers do not project into the opening farther than the outermost grooves in the end walls of the carrier. Moreover, the enlarged recessed regions at the four corners of the central opening are recessed only for the grooves that hold the outermost leads, and for the remaining leads the grooves are longer and the opposite edges 28 and 30 of the narrowed central portion of the opening are spaced just slightly outwardly from the opposite edges of the flat pack body.

In using the integrated circuit carrier, the integrated circuit flat pack is preferably held by a vacuum head (not shown) attached to the top of the integrated circuit body. The four retaining fingers are simultaneously pushed laterally outwardly by an actuating mechanism that includes four movable actuating pins (not shown) for applying a substantially horizontal outward force (in the direction of the arrows shown at 96 in FIG. 4) to the front faces 70 of the first retaining fingers and a similar substantially horizontal outward force to the front faces 85 the second retaining fingers. This bends the fingers simultaneously away from the opening toward the end walls 40 and 42, to a retracted position in which the tips of the retaining fingers are held spaced apart farther than the distance between the outermost leads of the flat pack. While the actuating pins are holding the fingers in their retracted positions the vacuum head is lowered to place the integrated circuit body in the central opening 26 of the carrier. By spreading the resilient fingers apart, further into the corners of the opening, the integrated circuit body can easily fit into the central opening while the leads of the integrated circuit body are being positioned in the grooves at opposite ends of the carrier opening. Once the integrated circuit body is in place in the opening the vacuum head is retracted and the generally horizontal force from the pins on the tips of the fingers is released. This allows the fingers to immediately return to their normal positions; and in this position the tapered bottom edges 72 and 87 of the flanged tips of the fingers fit over and are held in frictional contact with the adjacent outermost leads of the integrated circuit to retain the integrated circuit in the carrier. In one embodiment, the actuating pins apply a force of the tips of the fingers at an angle of 85 degrees from vertical with a 5 degree upward component in its direction of the outward force applied by each pin. The fingers are pushed backwardly toward the narrow tapered open spaces 76, 78, 90, and 92, and the resilient retaining fingers can contact the rear walls 40 and 42 adjacent these narrow open spaces when being spread apart. The walls thus act as stops and limit the amount of stress placed on the retaining fingers.

Thus, the integrated circuit flat pack is retained in the carrier by connection to the leads rather than the body of the flat pack. This leaves a top and bottom of the flat pack body entirely exposed, permitting easy marking of the flat pack body.

The retaining fingers 62, 64, 80 and 82 are long and narrow and therefore have high flexibility and sufficient memory to return to their original positions after repetitive use of the carrier. The pivot point of the retaining fingers is from the supporting web at the center of the opposite ends of the opening 26, and the retaining fingers extend generally parallel to the ends of the opening (and generally parallel to the leads of the flat pack). This enables the retaining fingers to have sufficient length to make them highly flexible. The length and resulting flexibility and therefore the memory of the retaining fingers is much greater than with the integrated circuit carrier disclosed in my U.S. Pat. No. 4,379,505. The high flexibility of the retaining fingers also makes it possible to produce an anti-static carrier. The carrier material can be loaded with carbon or other fillers to increase the electrical conductivity of the carrier to effectively discharge static electricity. The increased filler for anti-static purposes, however, decreases the inherent ductility of the carrier and therefore the flexibility of the retaining fingers. With the longer flexible retaining fingers of this carrier, sufficient fillers can be added to produce such an anti-static carrier while the flexibility of the retaining fingers is still sufficient that the retaining fingers can constantly be bent and return to their original positions during continued reuse of the carrier. The carrier is also more structurally sound and a simpler mechanism can be used to open the fingers of the carrier when compared with the carrier disclosed in U.S. Pat. No. 4,379,505. During use, when the fingers are spread apart they do not reach their stress point because the contact with the walls 40 and 42 behind the fingers limits the stress on the fingers. The fingers contact the wall which acts as a stop against further outward movement of the fingers and thereby limits the stress imposed on the fingers during outward bending of the retaining fingers. By positioning the retaining fingers in pairs in generally longitudinal orientations along opposite ends of the flat pack, integrated circuits with more leads can be accommodated than with the carrier in U.S. Pat. No. 4,379,505, for example. That carrier was limited to 16-lead integrated circuits, but the present integrated circuit carrier can accommodate integrated circuits having up to 24 leads.

The flat pack body can be brittle and therefore is susceptible to damage. By avoiding contact between the flat pack body and any movable retaining means the chance of damage to the flat pack body is minimized.

The positions of the leads from the flat pack body are typically manufactured with extremely low tolerances, commonly within narrower tolerances than the flat pack body itself. Hence, attachment to the leads rather than the body can be more easily controlled by automated equipment. Automated equipment for inserting an integrated circuit into the carrier also can be simplified, requiring only a two step process of applying the substantially horizontal force to the pins for spreading apart the retaining fingers and the application of the vacuum head for placing the circuit in the opening of the carrier.

The carrier also permits the integrated circuit to be removed from the carrier and have its leads bent into desired configurations and then have the integrated circuit replaced in the carrier. For example, all the leads in the integrated circuit can be bent, or only alternating leads can be bent in a staggered configuration. Either configuration may be necessary for subsequent attachment to various types of printed circuit boards. Once the leads are bent the integrated circuit can be picked up by a vacuum head and placed back in the carrier. The remaining straight portions of the leads close to the integrated circuit body can be contacted by the retaining fingers and also fit into the inner portions of the grooves at opposite ends of the carrier. In presently known carriers having long bars on opposite ends that project across the opening near the end walls of the carrier, the bars interfere with the bent leads of the flat pack and prevent the flat pack from being reinserted into the carrier.

What is claimed is:

1. A carrier for an integrated circuit flat pack having a body with a plurality of leads projecting from opposite ends of the body, the carrier comprising a base; an opening in the base for receiving the body of the flat pack, the opening having opposite ends, spaced apart sides each extending between the opposite ends of the opening, and corner regions at the opposite ends of each side of the opening; lead-supporting walls adjacent the opposite ends of the opening having a plurality of grooves for receiving the leads of the flat pack, the grooves extending along generally parallel axes that traverse the opening; resilient retaining fingers supported from generally central regions of support on the opposite sides of the opening between said lead-supporting walls of the base, the retaining fingers on each side of the opening extending from said central region of support in opposite directions toward the respective corners of the opening and extending generally parallel to the length of the grooves in the lead-supporting walls, the retaining fingers having tips with lead-connecting means that project toward the opening generally perpendicular to the length of the fingers and to the length of the grooves at the opposite ends of the opening; the retaining fingers being bendable outwardly away from the opening under application of an external bending force generally horizontally outwardly for allowing the leads of the flat pack to bypass the bent retaining fingers and fit into the grooves at opposite ends of the opening, the retaining fingers returning to a normal locking position, when the external bending force is released, for positioning the lead-connecting means at the tips of the fingers over adjacent leads of the flat pack for retaining the flat pack body in the opening of the carrier.

2. Apparatus according to claim 1 in which the opening is generally rectangular with enlarged corner regions, and in which separate retaining fingers project into corresponding enlarged corner regions of the opening, said enlarged corner regions for extending the length of the retaining fingers and providing a space into which the retaining fingers can be bent.

3. Apparatus according to claim 1 in which the retaining fingers are spaced inwardly from side walls of the opening that extend between the grooved lead-supporting walls of the base; and in which the fingers are bendable generally horizontally toward the side walls which act as stops against further outward bending movement of the retaining fingers.

4. Apparatus according to claim 1 in which the lead-connecting means on the tips of the retaining fingers are aligned longitudinally with and project inwardly at an elevation above the bottom of the outermost grooves at opposite ends of the opening.

5. Apparatus according to claim 1 in which the lead-connecting portions of the fingers on each side of the opening are spaced apart by a distance slightly greater than the width of the flat pack body so the lead-connecting means engage the leads where they have the greatest stiffness.

6. Apparatus according to claim 1 in which the flat pack body is unsupported in the central opening and the leads are supported by the grooves in the lead-supporting walls and the connections to the retaining fingers.

7. Apparatus according to claim 1 in which the integrated circuit carrier is made from an anti-static material having a filler that increases electrical conductivity but decreases ductility of the material.

8. A method for placing an integrated circuit flat pack into an integrated circuit carrier, in which the flat pack has a body with a plurality of leads projecting from opposite ends of the body; and the carrier has a central opening with generally parallel grooves adjacent opposite ends of the central opening, a pair of first resilient elongated retaining fingers having a first means of support near the center of a first side of the opening and extending from their first support means in opposite directions generally parallel to the grooves and terminating in free ends near the opposite corners at the first side of the opening, and a pair of second resilient elongated retaining fingers having a second means of support near the center of an opposite second side of the opening and extending from their second support means in opposite directions generally parallel to the grooves and terminating in free ends near opposite corners at the second side of the opening; the method comprising the steps of placing the flat pack in the carrier by first applying a generally horizontal force to the retaining fingers to spread them apart away from the opening and toward the first and second sides of the opening at which they are supported, by forcing the free ends of each pair of the retaining fingers toward their respective corners of the opening in response to pivoting the retaining fingers generally horizontally about their respective means of support; placing the flat pack body in the central opening with the leads positioned in the grooves; and then releasing the generally horizontal force on the fingers to allow the fingers to bend back inwardly toward the opening to a normal position in which connecting means on the tips of the fingers extend over the outermost leads of the flat pack to contact the fingers and retain the flat pack in the carrier.

9. The method according to claim 8 including providing a space on the side of each finger away from the central opening so that each finger can be bent into the space and can contact a rear wall of the space to provide a stop against further outward bending movement of the fingers to limit the stress imposed on the fingers.

10. The method according to claim 8 in which the flat pack body is unsupported in the central opening, and the leads are supported by the grooves in the lead-supporting walls and the connections to the retaining fingers.

11. Apparatus according to claim 6 in which the opening is generally rectangular with enlarged corner regions, and in which separate retaining fingers project into corresponding enlarged corner regions of the opening, said enlarged corner regions for extending the length of the fingers and providing a space into which the retaining fingers can be bent.

12. Apparatus according to claim 11 in which the retaining fingers are spaced inwardly from the enlarged corner regions of the opening, and in which the retaining fingers are bendable generally horizontally toward the side walls which act as stops against further outward bending movement of the retaining fingers.

13. Apparatus according to claim 2 in which the retaining fingers are spaced inwardly from the enlarged corner regions of the opening, and in which the retaining fingers are bendable generally horizontally toward the side walls which act as stops against further outward bending movement of the retaining fingers.

14. Apparatus according to claim 13 in which the integrated circuit carrier is made from an anti-static material having a filler that increases electrical conductivity but decreases ductility of the material.

* * * * *